(12) United States Patent
Teraishi

(10) Patent No.: US 6,518,848 B2
(45) Date of Patent: Feb. 11, 2003

(54) OSCILLATION STOP DETECTION CIRCUIT

(75) Inventor: Toshio Teraishi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/908,552

(22) Filed: Jul. 20, 2001

(65) Prior Publication Data

US 2002/0017925 A1 Feb. 14, 2002

(30) Foreign Application Priority Data

Jul. 24, 2000 (JP) ........................... 2000-221712

(51) Int. Cl.[7] ................................................. H03B 1/00
(52) U.S. Cl. ............................................. 331/74; 331/64
(58) Field of Search .................................. 331/74, 64, 17, 331/47

(56) References Cited

U.S. PATENT DOCUMENTS 5,949,261 A * 9/1999 Field et al. ................. 327/142
6,384,644 B2 * 5/2002 Yamazaki .................... 326/57

FOREIGN PATENT DOCUMENTS

JP 11097998 * 9/1999

* cited by examiner

*Primary Examiner*—Robert Pascal
*Assistant Examiner*—Kimberly E Glenn
(74) *Attorney, Agent, or Firm*—Volentine Francos, PLLC

(57) ABSTRACT

An oscillation stop detection circuit comprises delay means for delaying an oscillation signal having a predetermined cycle by a predetermined time to thereby output a delayed signal therefrom, detecting means for exclusive-ORing the oscillation signal and the delayed signal to thereby detect the presence of the oscillation signal and outputting a pulse signal in the predetermined cycle when the oscillation signal exists, and charge and discharge means having a capacitor electrically connected between an output node for outputting a detection signal indicative of whether the oscillation signal is at a stop and a source potential or a ground potential, and for discharging the capacitor when the pulse signal is supplied and charging the capacitor according to a predetermined time constant while the pulse signal is unsupplied.

6 Claims, 4 Drawing Sheets

OSCILLATION STOP DETECTION CIRCUIT

BACKGROUND OF THE INVENTION

1. Field of the Invention

The present invention relates to an oscillation stop detection circuit which is suitable for use in a semiconductor integrated circuit (hereinafter called "IC") or the like having a oscillation circuit and detects the stop of oscillation thereof.

2. Description of the Related Art

As an IC such as a real-time clock or the like for creating a waveform having a predetermined cycle through the use of a crystal oscillator or a CR oscillator, using it for an internal synchronization or synchronous signal and outputting it to the outside, there is known one having a configuration wherein even during a period in which a power supply for a system is at a halt, backup power is supplied so that only an oscillation circuit or oscillator and its peripheral circuits continue to operate. When a backup state continues for a long time in the IC provided with such a backup function, a supply voltage such as a backup battery or the like is reduced after a while so that an oscillating operation is stopped. When the power supply for the system is turned on to bring the IC to its normal state after the stop of the oscillating operation, the oscillating operation is resumed but the time of a clock or the time of a timer results in a false value. However, it is not possible to recognize, through the use of the oscillator alone, whether the value is incorrect. Thus, the provision of an oscillation stop detection circuit for detecting the stop of an oscillating operation in a backup state inside an IC therefor becomes effective.

FIG. 6 is a circuit diagram of a conventional oscillation stop detection circuit.

The present oscillation stop detection circuit has an input terminal 11 supplied with a clock signal CLK from an unillustrated oscillator circuit. The gates of an N channel MOS transistor (hereinafter called "NMOS") 12 and a P channel MOS transistor (hereinafter called "PMOS") 13 are electrically connected to the input terminal 11. The source of the NMOS 12 is electrically connected to a ground potential GND, and the drain thereof is electrically connected to a node N1. The source of the PMOS 13 is electrically connected to a source potential VDD through a resistor 14, and the drain thereof is electrically connected to the node N11. Further, the input of an inverter 15 is electrically connected to the input terminal 11, and the gates of an NMOS 16 and a PMOS 17 are electrically connected to the output of the inverter 15. The source of the NMOS 16 is electrically connected to the ground potential GND, and the drain thereof is electrically connected to a node N12. The source of the PMOS 17 is electrically connected to the source of the PMOS 13, and the drain thereof is electrically connected to the node N12.

Capacitors 18 and 19 are respectively electrically connected between the nodes N11 and N12 and the ground potential GND. Further, the nodes N11 and N12 are respectively electrically connected to the input of a two-input OR gate (hereinafter called "OR") 20. The output of the OR 20 is electrically connected to an output terminal 21. When the clock signal CLK supplied to the input terminal 11 stops, a detection signal OUT is outputted from the output terminal 21.

FIG. 7 is a timing chart showing the operation of the oscillation stop detection circuit shown in FIG. 6.

When a clock signal CLK having a level "H" is inputted to the input terminal 11 at a time T1 in FIG. 7, the gates of the NMOS 12 and PMOS 13 go "H". Thus, the NMOS 12 is brought to an on state and the PMOS 13 is brought to an off state, so that the node N11 is reduced to a level "L".

On the other hand, the clock signal CLK is inverted by an inverter 15 from which it is supplied to the gates of the NMOS 16 and PMOS 17. Thus, the NMOS 16 is brought to an off state and the PMOS 17 is brought to an on state, so that the potential at the node N12 rises. However, since the source of the PMOS 17 is electrically connected to the source potential VDD through the resistor 14, and the capacitor 19 is electrically connected between the node N12 and the ground potential GND, the potential at the node N12 rises gently. Therefore, the potential at the node N12 reaches a threshold voltage Vt or less of the OR 20 for a while from the time T1, and a detection signal OUT outputted from the OR 20 goes "L".

When the clock signal CLK inputted to the input terminal 11 changes to the level "L" at a time T2 while the detection signal OUT of the OR20 is "L", the gates of the NMOS 16 and PMOS 17 go "H". Thus, the NMOS 16 is brought to an on state and the PMOS 17 is brought to an off state, so that an electrical charge stored or charged in the capacitor 19 is discharged through the NMOS 16, and hence the node N12 is reduced to the level "L".

On the other hand, the NMOS 12 is brought to an off state and the PMOS 13 is brought to an on state, so that the potential at the node N11 rises. Since, however, the source of the PMOS 13 is electrically connected to the source potential VDD through the resistor 14 and the capacitor 18 is electrically connected between the node N11 and the ground potential GND, the potential at the node N11 rises gradually. Therefore, the potential at the node N11 reaches the threshold voltage Vt or less of the OR 20 for a while from the time T2, and a detection signal OUT outputted from the OR 20 remains held in an "L" state.

Similarly, even if the clock signal CLK inputted to the input terminal 11 changes to the level "H" at a time T3 while the detection signal OUT of the OR 20 is "L", and the clock signal CLK inputted to the input terminal 11 changes to the level "L" at a time T4 while the detection signal OUT of the OR 20 is "L", the detection signal OUT outputted from the OR 20 is always held in the "L" state.

Now consider where the oscillator circuit stops operating at a time T5, for example, and the clock signal CLK supplied to the input terminal 11 remains held in an "H" state. Since the NMOS 12 is brought to an on state and the PMOS 13 is brought to an off state, the node N11 is reduced to the level "L". On the other hand, the NMOS 16 is brought to an off state and the PMOS 17 is brought to an on state, whereby the potential at the node N12 rises. The potential at the node N12 rises gently, and a detection signal OUT outputted from the OR 20 goes "L" for a while. However, if this state goes on, then the potential at the node N12 reaches the threshold voltage Vt of the OR 20 and the detection signal OUT outputted from the OR 20 goes "H" at a time T6.

Contrary to the above, when the oscillator circuit is deactivated in a state in which the clock signal CLK supplied to the input terminal 11 is "L", the NMOS 16 is turned on and the PMOS 17 is turned off, so that the node N12 is reduced to the level "L". On the other hand, when the NMOS 12 is brought to an off state and the PMOS 13 is brought to an on state, and hence the potential at the node N11 rises. The potential at the node N11 rises gently, and a detection signal OUT outputted from the OR 20 goes "L" for a while. However, if this state goes on, then the potential at the node N11 reaches the threshold voltage Vt of the OR 20 and the detection signal OUT outputted from the OR 20 goes "H".

Thus, the conventional oscillation stop detection circuit is provided with two sets of circuits for detection in association with the level "H" or "L" at the time that the clock signal CLK stops. Further, the values of the resistor 14 and capacitors 18 and 19 are suitably set according to the cycle of a clock signal CLK to be detected. While the stable clock signal CLK is being inputted, the detection signal OUT is rendered "L" and outputted in its state. When the clock signal CLK stops, the detection signal OUT is rendered "H" and outputted in its state.

However, the conventional oscillation stop detection circuit has the following problems.

Namely, the two sets of circuits for detection are provided in association with the case where the clock signal CLK stops in the "H" or "L" state, and their configurations are complex. In particular, a problem arises in that in order to assure the stable detecting operation, the values of the resistor 14 and capacitors 18 and 19 must be designed larger, whereby the oscillation stop detection circuit increases in pattern area and the IC increases in chip size.

SUMMARY OF THE INVENTION

An object of the present invention is to provide an oscillation stop detection circuit capable of solving a problem involved in the prior art, reducing a pattern area and reliably detecting the stop of oscillation.

In order to solve the problem, an oscillation stop detection circuit comprises delay means for delaying an oscillation signal having a predetermined cycle by a predetermined time to thereby output a delayed signal therefrom, detecting means for exclusive-ORing the oscillation signal and the delayed signal to thereby detect the presence of the oscillation signal and outputting a pulse signal in the predetermined cycle when the oscillation signal exists, and charge and discharge means having a capacitor electrically connected between an output node for outputting a detection signal indicative of whether the oscillation signal is at a stop and a source potential or a ground potential, and for discharging the capacitor when the pulse signal is supplied and charging the capacitor according to a predetermined time constant while the pulse signal is unsupplied.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
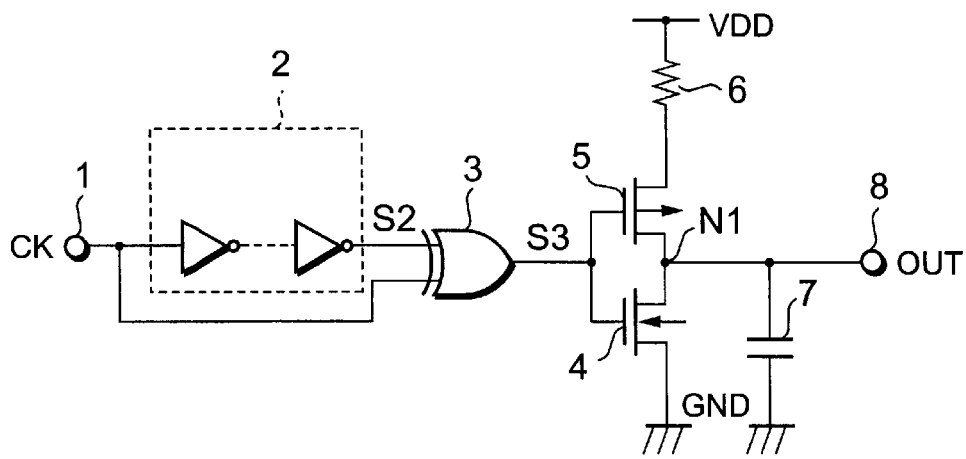
FIG. 1 is a circuit diagram of an oscillation stop detection circuit showing a first embodiment of the present invention.

Preferred embodiments of the present invention will hereinafter be described in detail with reference to the accompanying drawings.
First Embodiment FIG. 1 is a circuit diagram of an oscillation stop detection circuit or detector showing a first embodiment of the present invention.

The present oscillation stop detection circuit is built in an IC such as a real-time clock or the like and has an input terminal 1 supplied with, for example, a clock signal CK having a duty ratio of 1/2 and a cycle T from an unillustrated oscillator circuit. The input of a delay circuit 2, which constitutes delay means, is electrically connected to the input terminal 1. The delay circuit 2 is one wherein, for example, an even number of inverters are connected in tandem. The delay circuit 2 delays the clock signal CK by a 1/4 cycle and outputs the delayed signal therefrom. The output of the delay circuit 2 is electrically connected to one input of an exclusive-OR gate (hereinafter called "EOR") 3 that constitutes detecting means. The other input of the EOR 3 is electrically connected to the input terminal 1.

The gates of an NMOS 4 and a PMOS 5 of the NMOS 4 and PMOS 5, a resistor 6 and a capacitor 7, all of which constitute charge and discharge means, are electrically connected to the output of the EOR 3. The source of the NMOS 4 is electrically connected to a ground potential GND, whereas the drain thereof is electrically connected to a node N1. The source of the PMOS 5 is electrically connected to a source potential VDD through the resistor 6, whereas the drain thereof is electrically connected to the node N1. The capacitor 7 is electrically connected between the node N1 and the ground potential GND, and an output terminal 8 is electrically connected to the node N1. When the clock signal CK supplied to the input terminal 11 stops, the stop of oscillation is detected and hence a detection signal OUT is outputted from the output terminal 8.

Figure 2:
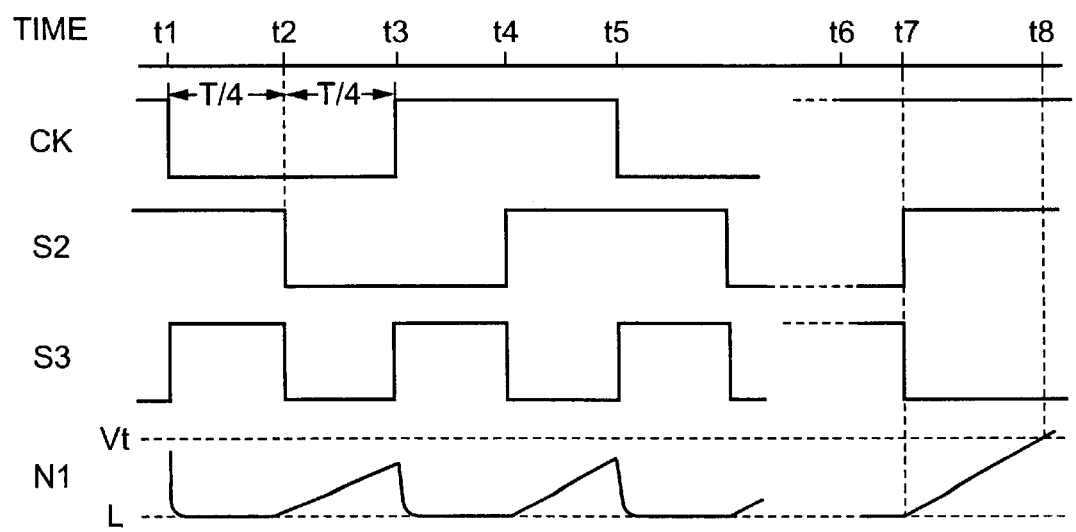
FIG. 2 is timing chart showing the operation of the oscillation stop detection circuit shown in FIG. 1.

FIG. 2 is a timing chart showing the operation of FIG. 1. The operation of FIG. 1 will be explained below with reference to FIG. 2.

When the clock signal CK inputted to the input terminal 1 changes from a level "H" to a level "L" at a time t1 in FIG. 2, a signal S2 outputted from the delay circuit 2 is rendered "H" at this time. Therefore, a signal S3 outputted from the EOR 3 goes "H". The output signal S3 is supplied to the gates of the NMOS 4 and PMOS 5 so that the NMOS 4 is turned on and the PMOS 5 is turned off. Thus, the electrical charge stored in the capacitor 7 is discharged through the NMOS 4 and the node N1 is reduced to the level "L".

At a time t2 at which time has elapsed by T/4 from the time t1, the output signal S2 of the delay circuit 2 goes "L". Since the clock signal CK still remains at the level "L" at this time, the output signal S3 of the EOR 3 goes "L" so that the NMOS 4 changes to an off state and the PMOS 5 changes to an on state. Thus, the charging of the capacitor 7 is started from the source potential VDD through the resistor 6 and the PMOS 5. However, since the value of the time constant of both the resistor 6 and capacitor 7 is set high, the potential at the node N1 rises gently. Therefore, the potential at the node N1 results in a threshold voltage Vt (e.g., Vt=VDD/2) or less for a while as counted from the time t1.

When the clock signal CK inputted to the input terminal 1 is changed to the level "H" while the potential at the node N1 is at the threshold voltage Vt or less, at a time t3 at which time has elapsed by T/2 from the time t1, the output signal S2 of the delay circuit 2 goes "L" and hence the output signal S3 of the EOR 3 goes "H". Thus, the NMOS 4 is brought to an on state and the PMOS 5 is brought to an off state, whereby the electrical charge stored in the capacitor 7 is discharged via the NMOS 4, and the node N1 is reduced to the level "L".

Further, the output signal S2 of the delay circuit 2 goes "H" at a time t4 at which time has elapsed by 3T/4 from the time t1. Since the clock signal CK still remains at the level "H" at this time, the output signal S3 of the EOR 3 is rendered "L" so that the NMOS 4 is changed to an off state and the PMOS 5 is changed to an on state. Thus, the charging of the capacitor 7 is started from the source potential VDD through the resistor 6 and the PMOS 5. However, the potential at the node N1 rises gently, and hence the potential at the node N1 still continues to remain at the threshold voltage Vt or less for a while.

At a time t5 at which time has elapsed by T from the time t1, the clock signal CK inputted to the input terminal 1 changes from the level "H" to "L" and thereafter returns to the state at the time t1, followed by repetition of operation similar to the above. Thus, as long as the clock signal CK is regularly supplied to the input terminal 1 in a predetermined cycle, the potential at the node N1 is always held at the threshold voltage Vt or less and the detection signal OUT outputted from the output terminal 8 is kept in the "L" state.

Now consider where at a time t6, for example, the oscillator circuit stops operating and the clock signal CK supplied to the input terminal 1 is held in an "H" state.

Since the output signal S2 of the delay circuit 2 goes "H" at a time t7 at which a predetermined delay time has elapsed, the output signal S3 of the EOR 3 is rendered "L" at this time. Thus, the NMOS 4 is brought to an off state and the PMOS 5 is brought to an on state so that the potential at the node N1 rises. The potential at the node N1 rises gradually and the detection signal OUT outputted from the output terminal 8 remains at the level "L" for a while. However, if this state goes on, then the potential at the node N1 reaches the threshold voltage Vt at a time t8 and hence the detection signal OUT outputted from the output terminal 8 goes "H".

When the oscillator circuit stops operating contrary to the above in a state in which the clock signal CK supplied to the input terminal 1 is taken "L", the output signal S2 of the delay circuit 2 goes "L" after a predetermined delay time has elapsed. Therefore, the output signal S3 of the EOR 3 goes "L". Thus, the NMOS 4 is turned off and the PMOS 5 is turned on, so that the potential at the node N1 continues to rise gently and thereby reaches the threshold voltage Vt. Therefore, the detection signal OUT outputted from the output terminal 8 goes "H".

Thus, the oscillation stop detection circuit according to the first embodiment has the delay circuit 2 for delaying the clock signal CK to be detected, and the EOR 3 for XORing the output signal S2 of the delay circuit 2 and the clock signal CK. Thus, even when the clock signal CK stops in either an "H" state or an "L" state, the output signal S3 of the EOR 3 stops at the level "L". Thus, one set of circuits for detection can detect the stop of oscillation, and hence a circuit configuration thereof can be simplified. Further, an advantage is brought about in that since only one capacitor large in pattern area may be used, the IC can be reduced in chip size.

Second Embodiment

Figure 3:
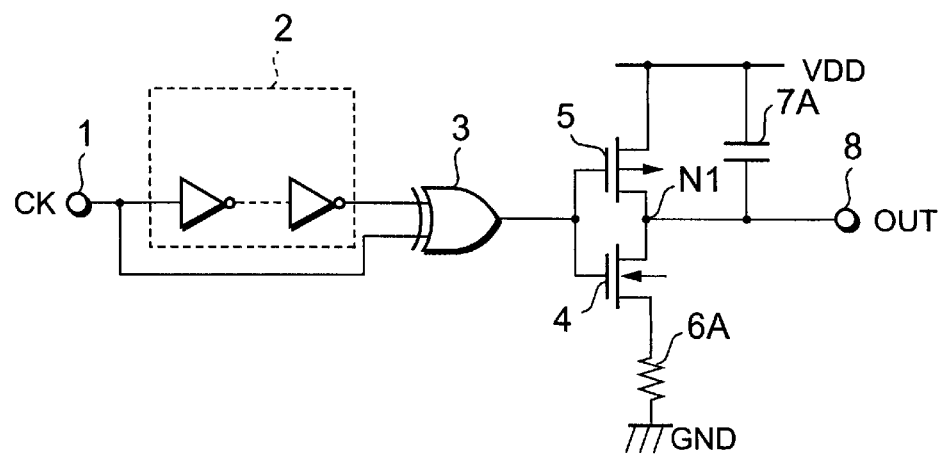
FIG. 3 is a circuit diagram of an oscillation stop detection circuit illustrating a second embodiment of the present invention.

FIG. 3 is a circuit diagram of an oscillation stop detection circuit showing a second embodiment of the present invention. Elements common to the elements shown in FIG. 1 are respectively identified by common reference numerals.

In the oscillation stop detection circuit according to the present embodiment, the resistor 6 electrically connected between the source of the PMOS 5 and the source potential VDD in FIG. 1 is omitted, and the source of the PMOS 5 is directly connected to the source potential VDD. Further, a resistor 6A is provided between the source of the NMOS 4 and the ground potential GND. In place of the capacitor 7 electrically connected between the node N1 and the ground potential GND in FIG. 1, a capacitor 7A is electrically connected between the node N1 and the source potential VDD. The oscillation stop detection circuit is similar to that shown in FIG. 1 in other configurations.

The operation of such an oscillation stop detection circuit is substantially similar to that of the oscillation stop detection circuit shown in FIG. 1 and has an advantage similar to it. In the oscillation stop detection circuit, however, as long as a logical value of a detection signal OUT is inverted and a clock signal CK is regularly supplied to an input terminal 1 in a predetermined cycle, the potential at the node N1 is always held at a threshold voltage Vt or higher, and the detection signal OUT outputted from an output terminal 8 is held in an "H" state. When the clock signal CK stops, the detection signal OUT outputted from the output terminal 8 goes "L".

Third Embodiment

Figure 4:
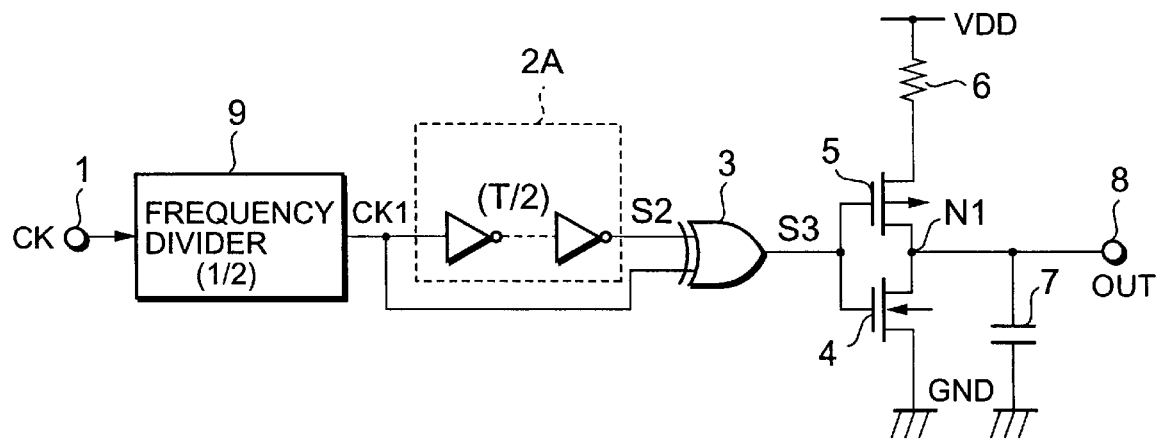
FIG. 4 is a circuit diagram of an oscillation stop detection circuit depicting a third embodiment of the present invention.

FIG. 4 is a circuit diagram of an oscillation stop detection circuit showing a third embodiment of the present invention. Elements common to those shown in FIG. 1 are respectively identified by common reference numerals.

In the present oscillation stop detection circuit, the input of a divider circuit 9, which constitutes dividing means, is electrically connected to an input terminal 1. The inputs of a delay circuit 2A and an EOR 3 are electrically connected to the output of the divider circuit 9. The divider circuit 9 divides a clock signal CK supplied to the input terminal 1 from an unillustrated oscillation circuit into 1/2 to thereby produce a clock signal CK1 whose duty ratio is accurately 1/2 and whose cycle is given as T. The delay circuit 2A is one wherein, for example, an even number of inverters are connected in tandem. The delay circuit 2 delays the clock signal CK1 by a time T/2 and outputs the delayed signal therefrom. The delay circuit 2A is similar to that shown in FIG. 1 in other configurations.

Figure 5:
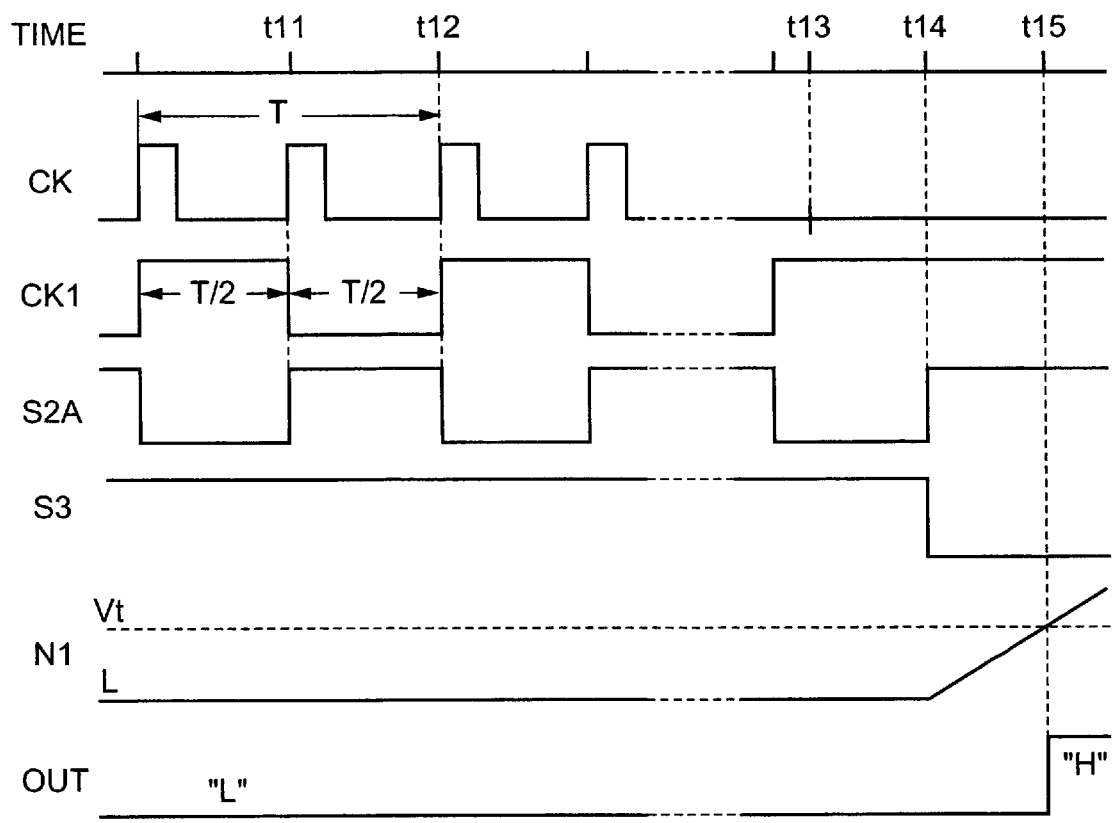
FIG. 5 is a timing chart showing the operation of the oscillation stop detection circuit shown in FIG. 4.
Figure 6:
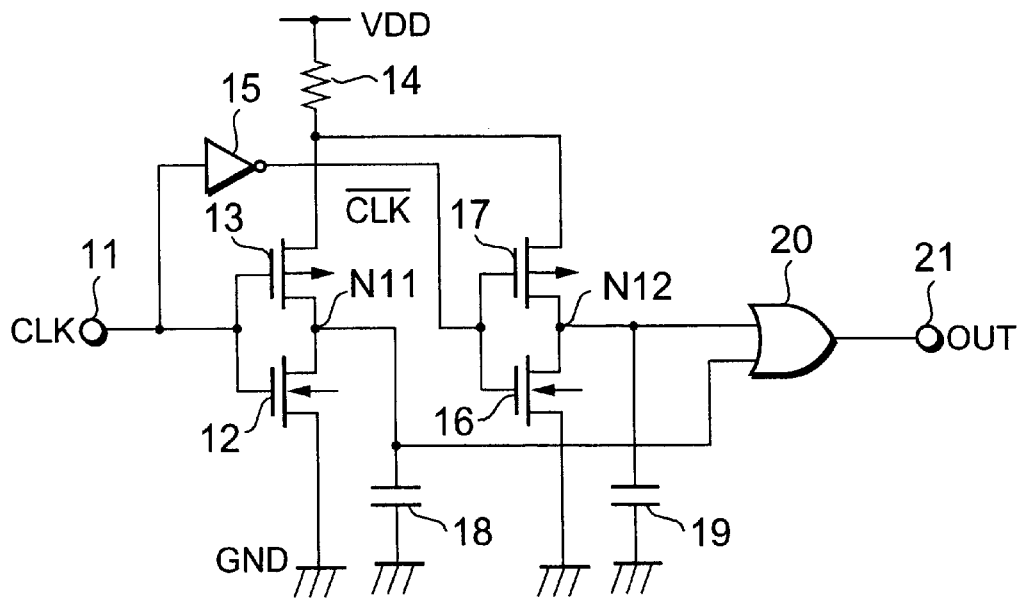
FIG. 6 is a circuit diagram of a conventional oscillation stop detection circuit.
Figure 7:
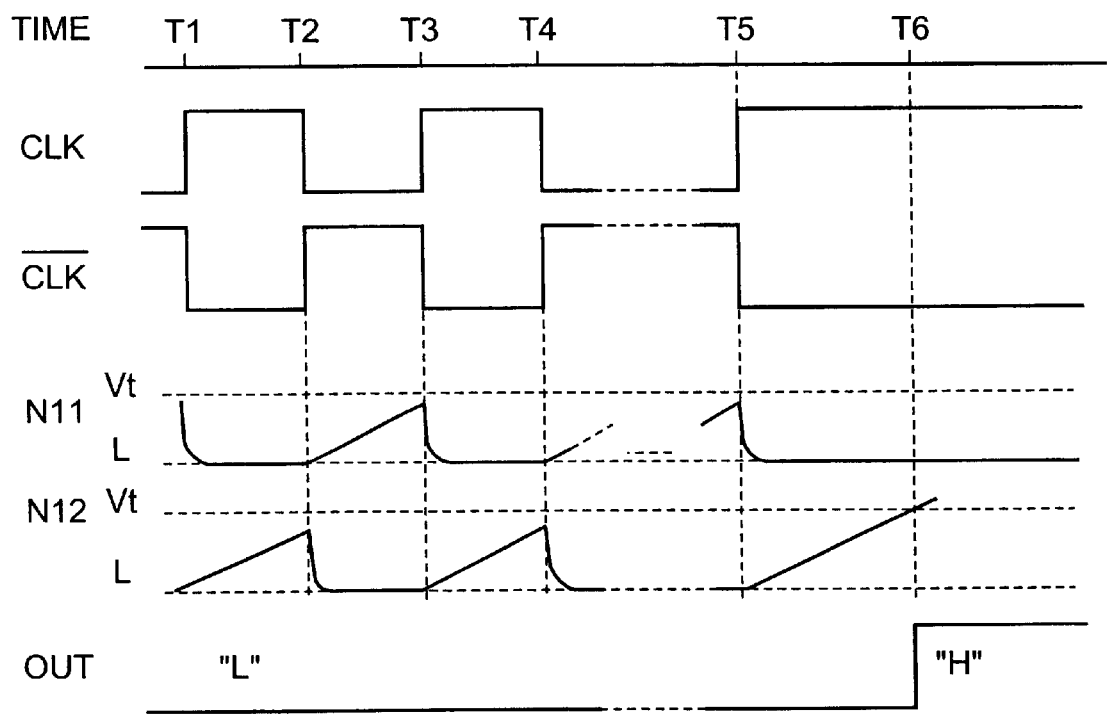
FIG. 7 is a timing chart showing the operation of the conventional oscillation stop detection circuit shown in FIG. 6.

FIG. 5 is a timing chart showing the operation of the oscillation stop detection circuit shown in FIG. 4. The operation thereof shown in FIG. 4 will be described below with reference to FIG. 5.

As shown in FIG. 5, a clock signal CK having a duty ratio of 1/4 and a cycle of 2T, for example, which is supplied to the input terminal 1, is divided into 1/2 by the divider circuit 9 to thereby produce a clock signal CK1 having a duty ratio of 1/2 and a cycle T.

When the clock signal CK1 changes from a level "H" to a level "L" at a time t11 in FIG. 5, a signal S2A outputted from the delay circuit 2A changes from the level "L" to "H" just at this time, and hence a signal S3 outputted from the EOR 3 goes "H. Since the output signal S3 is supplied to the gates of an NMOS 4 and a PMOS 5, the NMOS 4 is brought to an on state and the PMOS 5 is brought to an off state, so that an electrical charge stored in a capacitor 7 is discharged through the NMOS 4, thereby reducing an node N1 to the level "L".

When the clock signal CK1 changes from the level "L" to "H" at a time t12 at which time has elapsed by T/2 from the time ti11, the output signal S2A of the delay circuit 2A changes from the level "H" to "L" just at this time. Therefore, the output signal S3 of the EOR 3 remains at the level "H". Accordingly, the NMOS 4 is held on and the PMOS 5 is held off, and hence the node N1 is held in an "L" state.

Thus, the timing provided for a change in the clock signal CK1 and the timing provided for a change in the output signal SA2 of the delay circuit 2A coincide with each other while the clock signal CK is being periodically supplied to the input terminal 1. Further, the levels of their signals are complementarily inverted on an alternate basis. Thus, the output signal S3 of the EOR 3 always goes "H" and the node Ni goes "L", so that a detection signal OUT outputted from an output terminal 8 is held in an "L" state.

Now consider where at a time t13, for example, the oscillation circuit stops operating and the clock signal CK supplied to the input terminal 1 remain in an "H" or "L" state.

Thus, when the clock signal CK1 outputted from the divider circuit 9 stops while being held at the level "H", the output signal S2A of the delay circuit 2A goes "H" at a time t14 lying within a time T/2 from the time t13 at latest. Thus, the output signal S3 of the EOR 3 goes "L" so that the NMOS 4 is brought to an off state and the PMOS 5 is brought to an on state, whereby the potential at the node N1 starts to rise. The potential at the node N1 rises gently and the detection signal OUT outputted from the output terminal 8 goes "L" for a while. However, if this state goes on, then the potential at the node N1 reaches a threshold voltage Vt at a time t15 and hence the detection signal OUT outputted from the output terminal 8 goes "H".

When the oscillator circuit stops operating contrary to the above in a state in which the clock signal CK1 is taken "L", the output signal S2A of the delay circuit 2A goes "L" after a predetermined delay time has elapsed. Therefore, the output signal S3 of the EOR 3 goes "L". Thus, the NMOS 4 is turned off and the PMOS 5 is turned on, so that the potential at the node N1 continues to rise gently and thereby reaches the threshold voltage Vt. Therefore, the detection signal OUT outputted from the output terminal 8 goes "H".

Thus, the oscillation stop detection circuit according to the third embodiment has the divider circuit 9. for dividing the clock signal CK to be detected into 1/2 to thereby produce the clock signal CK1 having the duty ratio of 1/2 and the cycle of T, the delay circuit 2A for delaying the clock signal CK1 by the time T2, and the EOR 3 for XORing the output signal S2A of the delay circuit 2A and the clock signal CK1. Thus, the present embodiment has an advantage similar to the first embodiment. Since the capacitor 7 is not charged while the clock signal CK is being detected, the capacitance thereof may be smaller than that employed in the first embodiment, and the stop of the clock signal CK can reliably be detected. Therefore, the present embodiment has an advantage in that the capacitor large in pattern area becomes unnecessary and the chip size of an IC can further be reduced.

Incidentally, the present invention is not limited to the above-described embodiments, and various modifications can be made thereto. For example, the following (a) through (d) are known as the modifications.

(a) The delay circuits 2 and 2A are not limited to ones wherein the even number of inverters are connected in tandem. If ones each capable of obtaining a predetermined time are used, then any circuit configurations may be applied.

(b) The charge and discharge means is not limited to the configuration of the NMOS 4, PMOS 5, resistor 6 and capacitor 7. A circuit may be used wherein the capacitor 7 is reliably charged and discharged by the output signal S3 of the EOR 3. For example, the charge and discharge means may adopt a configuration wherein the PMOS 5 is omitted and the resistor 6 is connected between the node N1 and the source potential VDD.

(c) The divider circuit 9 is not limited to the 1/2 division. As in the case of 1/4 division, 1/8 division or the like, for example, one may be used which is capable of obtaining a clock signal CK1 having a duty ratio of 1/2.

(d) While each of the above-described embodiments has been described on the precondition that the oscillation stop detection circuit is built in the IC, it may also be used as an independent oscillation stop detection circuit.

According to each of the first and second embodiments as described above in detail, an oscillation stop detection circuit has delay means for delaying an oscillation signal by a predetermined time and outputting the delayed signal therefrom, and detecting means for XORing the oscillation signal and the delayed signal to thereby detect the presence of the oscillation signal. Further, it has also charge and discharge means for discharging a capacitor according to a pulse signal outputted when the oscillation signal exists and charging the capacitor when the oscillation signal stops. Therefore, an advantageous effect is brought about in that one capacitor may be provided regardless of the level of the oscillation signal at the stop of oscillation, and an IC can be reduced in pattern area.

According to the third embodiment, an oscillation stop detection circuit has dividing means for producing a clock signal having a duty ratio of 1/2 and a cycle of T, delay means for delaying the clock signal by a nearly time of T2, and detecting means for XORing the pre- and post-delay clock signals to thereby output a pulse signal at all times while the oscillation signal exists. Further, the oscillation stop detection circuit has charge and discharge means for discharging a capacitor according to a pulse signal and charging the capacitor when the pulse signal stops. Therefore, an advantageous effect is brought about in that the stop of oscillation can reliably be detected by means of a capacitor small in capacitance, and an IC can further be reduced in pattern area.

What is claimed is:

1. An oscillation stop detection circuit comprising:
   a clock input terminal receiving a clock signal;
   a delay circuit connected to said clock input terminal for delaying the clock signal so as to output a delayed clock signal, said delay circuit delays the clock signal by a 1/4 cycle;
   an exclusive logic circuit connected to said clock input terminal and said delay circuit, said exclusive logic circuit outputting a pulse signal in response to the clock signal and the delayed clock signal;
   an output terminal outputting a detection signal; and
   a charge and discharge circuit connected to said exclusive logic circuit and said output terminal for outputting the detection signal in response to the pulse signal, said charge and discharge circuit including,
      a first transistor of a first conductivity type having a gate connected to receive the pulse signal, a first terminal connected to a first potential source, and a second terminal connected to said output terminal,
      a second transistor of a second conductivity type that is opposite to the first conductivity type, the second transistor having a gate connected to receive the pulse signal, a first terminal, and a second terminal connected to said output terminal, a resistive element connected between the first terminal of the second transistor and a second power source, and a capacitor connected between the first power source and said output terminal.

2. An oscillation stop detection circuit comprising:

a clock input terminal receiving a clock signal;

a delay circuit connected to said clock input terminal for delaying the clock signal so as to output a delayed clock signal, said delay circuit delays the clock signal by a 1/4 cycle;

a clock detection circuit connected to receive the clock signal and the delayed clock signal for detecting a presence of the clock signal and outputting a pulse signal when the clock signal exists;

an output terminal outputting a detection signal; and a charge and discharge circuit connected to said clock detection circuit and said output terminal for outputting the detection signal in response to the pulse signal, said charge and discharge circuit including a capacitor connected between the output terminal and a first power source, and for discharging the capacitor when the pulse signal is supplied and charging the capacitor while the pulse signal is not supplied.

3. An oscillation stop detection circuit comprising:

a clock input terminal receiving a clock signal having a first frequency;

a frequency divider connected to said clock input terminal, said frequency divider outputting a divided clock signal having a second frequency;

a delay circuit connected to said frequency divider for delaying the divided clock signal so as to output a delayed clock signal;

an exclusive logic circuit connected to said frequency divider and said delay circuit, said exclusive logic circuit outputting a pulse signal in response to the divided clock signal and the delayed clock signal;

an output terminal outputting a detection signal; and a charge and discharge circuit connected to said exclusive logic circuit and said output terminal for outputting the detection signal in response to the pulse signal, said charge and discharge circuit including, a first transistor of a first conductivity type having a gate connected to receive the pulse signal, a first terminal connected to a first potential source, and a second terminal connected to said output terminal, a second transistor of a second conductivity type that is opposite to the first conductivity type, the second transistor having a gate connected to receive the pulse signal, a first terminal, and a second terminal connected to said output terminal, a resistive element connected between the first terminal of the second transistor and a second power source, and a capacitor connected between the first power source and said output terminal.

4. An oscillation stop detection circuit as claimed in claim 3, wherein said exclusive logic circuit is an exclusive OR circuit.

5. An oscillation stop detection circuit as claimed in claim 3, wherein the second frequency is twice of the first frequency.

6. An oscillation stop detection circuit as claimed in claim 3, wherein said delay circuit delays the divided clock signal by a 1/2 cycle.

* * * * *